United States Patent
Iwai (10) Patent No.: US 7,616,502 B2
(45) Date of Patent: Nov. 10, 2009

(54) NONVOLATILE SEMICONDUCTOR MEMORY

(75) Inventor: Makoto Iwai, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/108,111

(22) Filed: Apr. 23, 2008

(65) Prior Publication Data

US 2008/0266967 A1      Oct. 30, 2008

(30) Foreign Application Priority Data

Apr. 24, 2007   (JP)   ............. 2007-114040

(51) Int. Cl.
 *G11C 11/34* (2006.01)
(52) U.S. Cl. ............... 365/185.25; 365/185.17
(58) Field of Classification Search ........... 365/185.25, 365/185.17, 185.18
See application file for complete search history.

(56) References Cited

U.S. PATENT DOCUMENTS

| | | | |
|---|---|---|---|
| 6,480,419 B2 * | 11/2002 | Lee | ............... 365/185.18 |
| 7,203,093 B2 | 4/2007 | Nguyen | |
| 7,206,235 B1 | 4/2007 | Lutze et al. | |
| 7,259,990 B2 * | 8/2007 | Maejima et al. | ......... 365/185.17 |
| 7,369,442 B2 * | 5/2008 | Lee et al. | ............... 365/185.25 |

\* cited by examiner

*Primary Examiner*—Anh Phung
(74) *Attorney, Agent, or Firm*—Oblon, Spivak, McClelland, Maier & Neustadt, L.L.P.

(57) ABSTRACT

A semiconductor memory device comprising: a memory cell array having memory cell units each formed by connecting a plurality of memory cells; a first and a second select gate transistors, the first select gate transistor being connected between one end of the memory cell array and a common source line, the second select gate transistor being connected between the other end of the memory cell array and bit lines; word lines acting also as control gates of the memory cells; a first select gate voltage-generating circuit for generating a first select gate voltage; a second select gate-setting circuit for setting an instructed value of a second select gate voltage; a second select gate voltage-generating circuit for generating the second select gate voltage based on the set, instructed value; a first transfer circuit for transferring the first select gate voltage generated by the first select gate voltage-generating circuit to a second select gate; a discharging circuit for discharging the first select gate voltage transferred to the second select gate; and a discharging characteristics selection circuit for selecting discharging characteristics of the discharging circuit.

10 Claims, 11 Drawing Sheets

30: VSGD-GENERATING CIRCUIT
20: VSGD-SETTING CIRCUIT
80: SWITCHING SIGNAL GENERATION

NONVOLATILE SEMICONDUCTOR MEMORY

CROSS-REFERENCE TO RELATED APPLICATIONS

This application is based upon and claims the benefit of priority from the prior Japanese Patent Application No. 2007-114040, filed Apr. 24, 2007, the entire contents of which are incorporated herein by reference.

BACKGROUND OF THE INVENTION

1. Field of the Invention

The present invention relates to an electrically rewritable nonvolatile semiconductor device and, more particularly, to a nonvolatile semiconductor memory device which has NAND cell units and in which plural select gate voltages are applied to select gate transistors during writing operation.

2. Description of the Related Art

An EEPROM in which data can be electrically rewritten is known as a nonvolatile semiconductor memory. Normally, floating gates acting as a charge storage layer and control gate stacked MOS transistors are used as memory cells in an EEPROM.

A NAND flash memory is known as a memory most adapted for providing increased capacity among EEPROMs. In the NAND flash memory, NAND cell units connected in series with each other are formed. In particular, adjacent ones of the memory cells share a source/drain diffusion layer. One end of each NAND cell unit is connected with a common source line via a first select gate transistor. The other end is connected with bit lines via a second select gate transistor. These NAND cell units share word lines and the select gates of select gate transistors to form a NAND cell array, the word lines being the control gates of memory cells.

In this NAND flash memory, 0 level (0 V) or 1 level (power voltage Vdd) is applied to each bit line according to writing data during writing of data. A given voltage VSOURCE is given to the common source line. A gate voltage of Vss is applied to the first select gate transistor. A gate voltage of VSG (=Vdd) is applied to the second select gate transistor. This turns off the first select gate transistor. The second select gate transistor is turned on. Consequently, 0 V is transferred to the channels of the NAND cell units including memory cells into which "0" is written. The channels of the NAND cell units including memory cells that are not written (i.e., maintained at "1") are electrically charged to Vdd-Vth, where Vth is the threshold value of the second select gate transistor. The second select gate transistor is turned off. The channels in the units are floated. Subsequently, a programming voltage of about 20 V is applied to word lines with which memory cells to be written are connected. A pass voltage of about 10 V is applied to word lines with which the other memory cells are connected. As a result, in the NAND cell units into which "0" is to be written, a high voltage is applied to the floating gates of the memory cells to be written. Electrons are injected from the substrate side via a tunnel oxide film. In consequence, the threshold value of the memory cells shifts in the positive direction, thus completing the writing. Meanwhile, in the NAND cell units not written, the channels are in floating state. Therefore, capacitive coupling between the control gate and the semiconductor substrate boosts the channels, inhibiting writing into the memory cells.

In the NAND cell unit not written in this way, it is necessary that the first and second select gate transistors be kept off. In practice, however, a slight amount of leakage current may be produced through the select gate transistors. Therefore, the channel voltage rises to Vdd-Vth. After the second select gate transistor has been turned off, in order to minimize the leakage current through the second select gate transistor, the gate voltage of the second select gate transistor is set to a second select gate voltage VSGD that is lower than the first select gate voltage VSG of about 4 V. However, if the second select gate voltage VSGD is lowered excessively, the select gate transistors of NAND cell units into which "0" will be written are also turned off. Therefore, it is impossible to reduce the voltage below the threshold voltage of the select gate transistors. Especially, where quick pass write (QPW) is implemented when data is written in order to control the distribution of threshold values to a narrow range, using a multi-valued memory, it is required that a bit voltage VBL_QPW of about 0.5 to 0.7 V be applied to the bit lines connected to the NAND cell units into which "0" is written and that the bit voltage be transferred to the channel in the second stage of the writing process. For this reason, the second select gate voltage VSGD is set to an appropriate value within a range of 1.2 to 3.6 V in the manufacturing stage of the device.

In this way, the second select gate voltage VSGD of 1.2 to 3.6 V is applied to the select gates on the bit line side during writing subsequently to the first select gate voltage VSG of about 4 V. When the select gate voltage is switched between the first select gate voltage VSG and the second select gate voltage VSGD, a period in which the select gates are discharged and a period in which the select gates are charged are necessary. It is assumed, for example, that the second select gate voltage VSGD is 2.5 V. If the periods are set to optimum values under this condition, it is likely that the target voltage is not reached even through the same period provided that the second select gate voltage VSGD is 1.2 V or 3.6 V. One conceivable solution to this problem is to set the period for which charging is done by the second select gate voltage VSGD to a sufficiently long time. In this case, there is the problem that the writing time is prolonged.

BRIEF SUMMARY OF THE INVENTION

A semiconductor memory device comprising: a memory cell array having memory cell units each formed by connecting a plurality of memory cells; a first and a second select gate transistors, the first select gate transistor being connected between one end of the memory cell array and a common source line, the second select gate transistor being connected between the other end of the memory cell array and bit lines; word lines acting also as control gates of the memory cells; a first select gate voltage-generating circuit for generating a first select gate voltage; a second select gate-setting circuit for setting an instructed value of a second select gate voltage; a second select gate voltage-generating circuit for generating the second select gate voltage based on the set, instructed value; a first transfer circuit for transferring the first select gate voltage generated by the first select gate voltage-generating circuit to a second select gate; a discharging circuit for discharging the first select gate voltage transferred to the second select gate; and a discharging characteristics selection circuit for selecting discharging characteristics of the discharging circuit.

DETAILED DESCRIPTION OF THE INVENTION

First Embodiment

Figure 1:
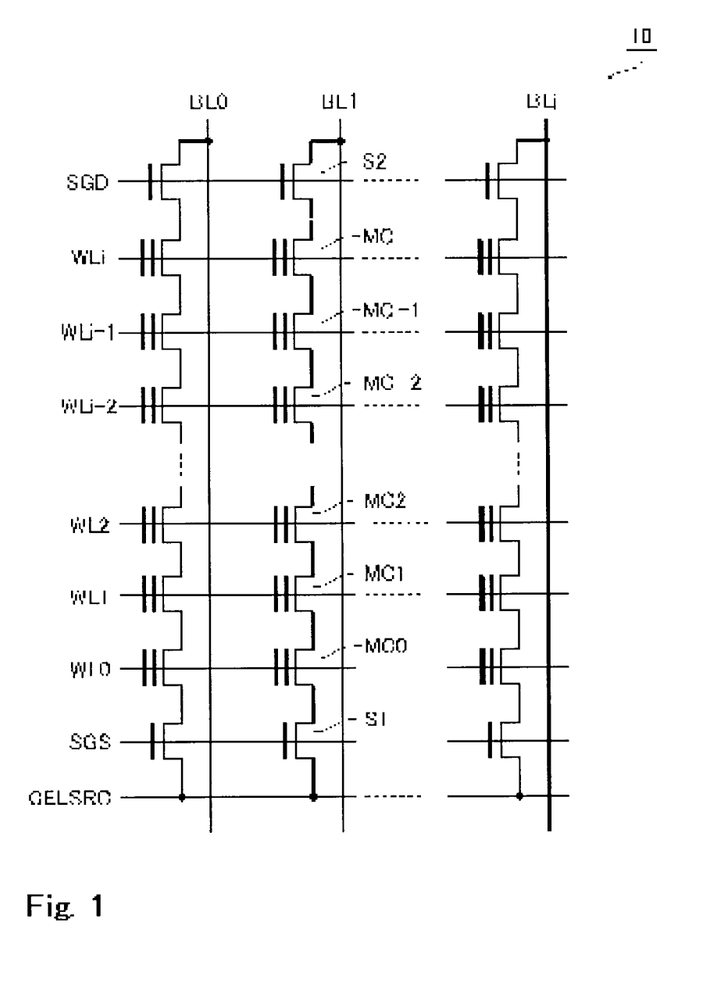
FIG. 1 is a circuit diagram of a NAND cell array of a NAND flash memory associated with a first embodiment of the present invention.

FIG. 1 is a circuit diagram of a NAND cell array (memory cell array) 10 of a NAND flash memory associated with a first embodiment of the present invention. Each one of NAND cell units constituting the NAND cell array 10 has a series combination of a plurality of memory cells MC0-MCi (hereinafter may be collectively referred to as the memory cells MC) and select gate transistors S1 and S2 connected with the opposite ends of the series combination of the cells. Adjacent ones of the memory cells share doped source/drain regions. The source of the first select gate transistor S1 is connected with a source line CELSRC. The drain of the second select gate transistor S2 is connected with bit lines BL0-BLj extending parallel to the direction of array of the memory cells MC. The control gates of the memory cells MC form word lines WL0-WLi perpendicular to the bit lines BL0-BLj. The gates of the select gate transistors S1 and S2 form select gates SGS and SGD perpendicular to bit lines 3. These NAND cell units share the word lines WL0-WLi and select gates SGS and SGD and are arranged in the direction of the word lines, forming the NAND cell array 10.

Figure 2:
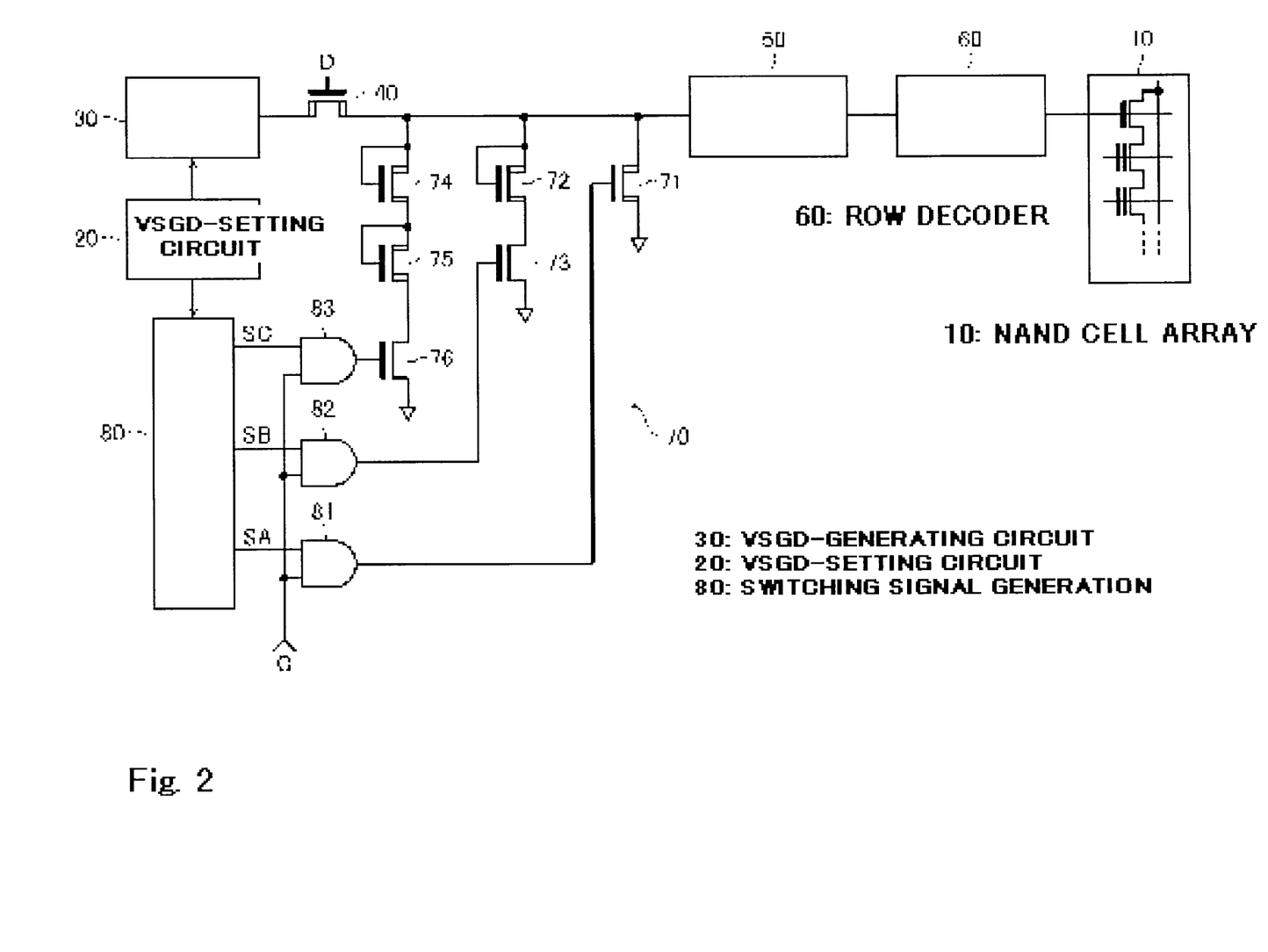
FIG. 2 is a circuit diagram of main portions of the first embodiment of the invention.

FIG. 2 is a circuit diagram of a circuit for controlling the voltage to the select gate SGD when the NAND cell array 10 associated with the first embodiment is written. This circuit applies the first select gate voltage VSG to the select gate SGD, then electrically discharges the select gate SGD, and subsequently applies the second select gate voltage VSGD lower than the first select gate voltage VSG.

Figure 3:
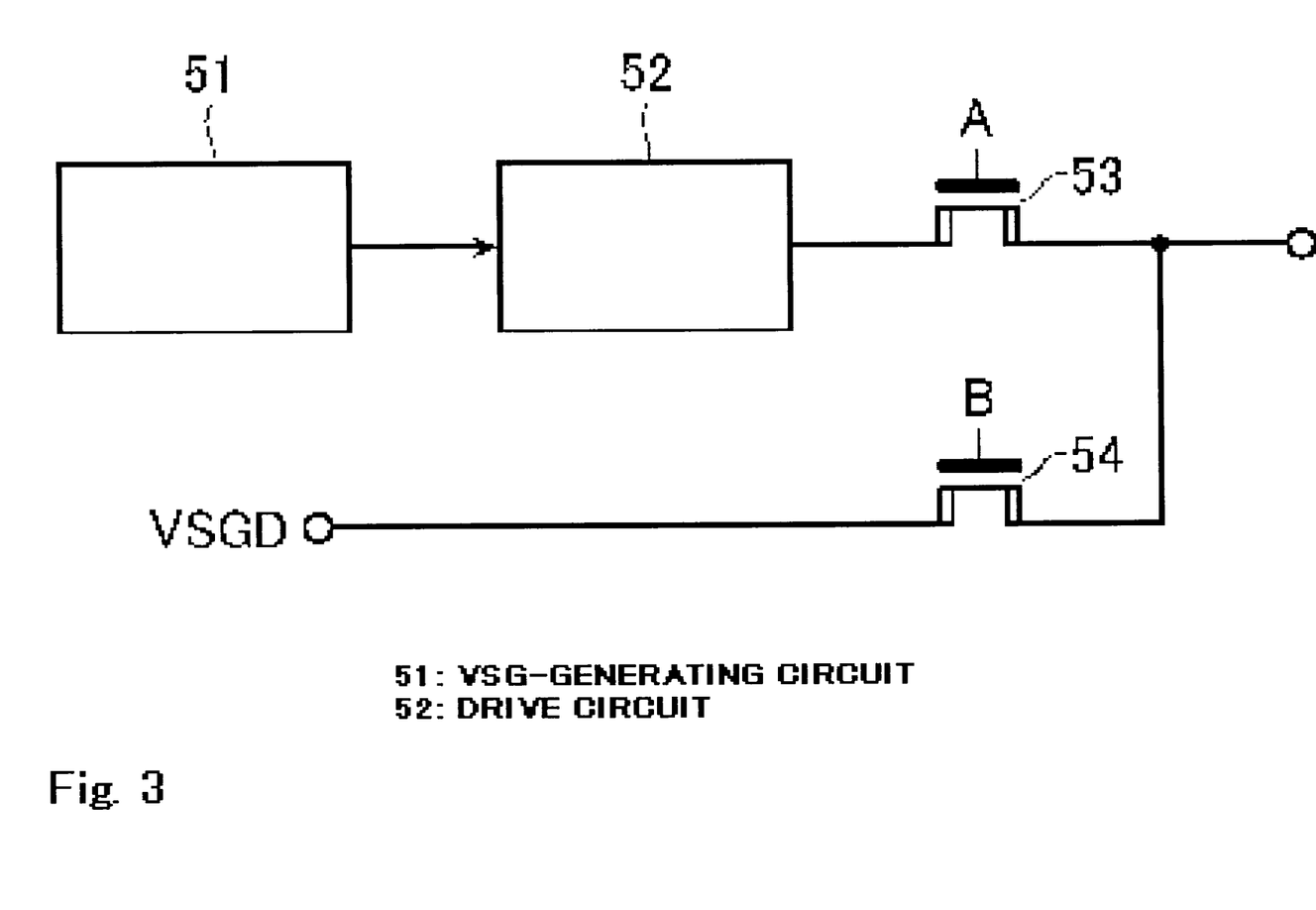
FIG. 3 is a circuit diagram of an SGD driver circuit shown in FIG. 2.

A VSGD-setting circuit 20 is made of a ROM fuse, for example. At the stage of manufacture of the device, a set value most adapted for the device is stored as the second select gate voltage VSGD. The output signal from the VSGD-setting circuit 20 is supplied to a VSGD-generating circuit 30, which in turn generates the second select gate voltage VSGD based on the set value for the VSGD-setting circuit 20. The generated second select gate voltage VSGD is supplied to a SGD driver circuit 50 via a transfer gate 40 made of a high voltage transistor (hereinafter may be referred to as a HV transistor). The SGD driver circuit 50 has a transfer system for the first select gate voltage VSG and a VSG discharge-and-VSGD transfer system, for example, as shown in FIG. 3. The VSG transfer system has a VSG-generating circuit 51 generating the select gate voltage VSG (e.g., of about 4 V), a drive circuit 52 for driving the gate with the generated select gate voltage VSG, and a transfer gate 53 for transferring the gate voltage VSG generated from the drive circuit 52 to the output side. The gate 53 is made of a high voltage transistor. The VSG discharge-and-VSGD transfer system has a transfer gate 54 made of a high voltage transistor having one input/output terminal shared with the input/output terminal of the VSG transfer system. The SGD driver circuit 50 is connected with the select gate SGD of the NAND cell array 10 via a row decoder 60.

A discharging circuit 70 having three discharge paths is connected between the SGD driver circuit 50 and the transfer gate 40. The first discharge path permits a maximum discharge current to flow, and is made of a high voltage transistor 71. The second discharge path permits the second greatest discharge current to flow, and is made up of a diode-connected, high voltage transistor 72 and a low voltage transistor 73 (hereinafter may be abbreviated the LV transistor 73) connected in series with the high voltage transistor 72. The third discharge path permits a minimum discharge current to flow, and is made of diode-connected, high voltage transistors 74 and 75 connected in series with a low voltage transistor 76. The diode-connected high voltage transistors 72, 74, and 75 are provided to prevent high voltages from being applied to the low voltage transistors 73 and 76. The channel widths W of the high voltage transistors 71, 72, 74, and 75 are set to be sufficiently greater than the channel widths of the low voltage transistors 73 and 76 according to the required discharging characteristics. The gate voltage of the high voltage transistor 71 may be set higher than the gate voltages of the low voltage transistors 73 and 76.

A switching signal-generating circuit 80 activates any one of select signals SA, SB, and SC, based on the set value set by the VSGD-setting circuit 20. The select signals SA, SB, and SC are entered into a respective one input terminal of gate circuits 81, 82, and 83. A control signal C that is activated during the discharge period is entered into the other input terminals of the gate circuits 81-83. The output signals from the gate circuits 81-83 are supplied to the gates of the high voltage transistor 71, low voltage transistor 73, and low voltage transistor 76, respectively. The switching signal-generating circuit 80 and gate circuits 81-83 together constitute a discharging characteristics selection circuit that selects any one discharge path during the discharge period.

The operation of the NAND flash memory constructed as described so far and performed during writing is next described.

Figure 4:
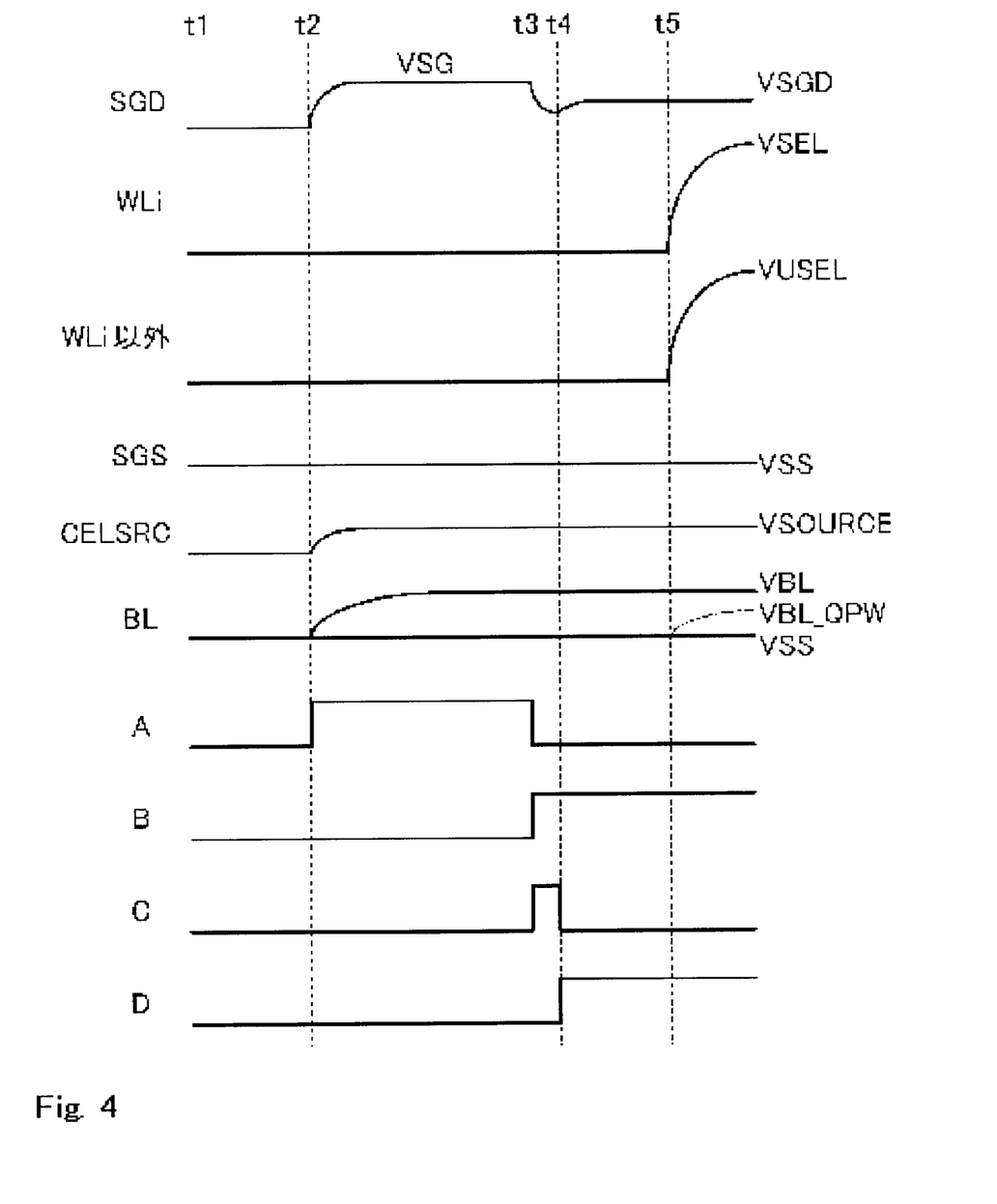
FIG. 4 is a timing chart illustrating the operation of the first embodiment.

FIG. 4 is a timing chart of various portions, indicating the writing operation.

When instant t2 comes after instant t1, the control signal A rises. The gate voltage Vss is supplied to the bit lines BL connected with the NAND cell units having memory cells into which "0" should be written. The bit voltage VBL (e.g., Vdd) is supplied to the other bit lines BL. The voltage VSOURCE (>Vss) is supplied to the common source line CELSRC. The level Vss is supplied to the select gate SGS of the first select gate transistor S1. At this time, the transfer gate 53 of FIG. 3 is turned on, transferring the first select gate voltage VSG to the second select gate SGD. Consequently, the select gate transistor S1 is turned off, while the select gate transistor S2 is turned on. The channels of the NAND cell units connected with the bit lines BL at the level Vss are maintained at the level Vss. The channels of the NAND cell units connected with the bit line BL at the bit voltage level VBL are charged up to VBL-Vth. The select gate transistor S2 connected with the NAND cell units whose channels have been charged up to VBL-Vth are turned off. The NAND cell units are floated.

At instant t3, the control signal A falls, whereas control signals B and C rise. As a result, the transfer gate 53 of FIG. 3 is turned off, while the transfer gate 54 is turned on. The first select gate voltage VSG charging the select gate SGD is discharged via the discharging circuit 70. At instant t4, the control signal C falls, stopping the discharging operation. The control signal D rises, starting transfer of the second select gate voltage VSGD.

Figure 5:
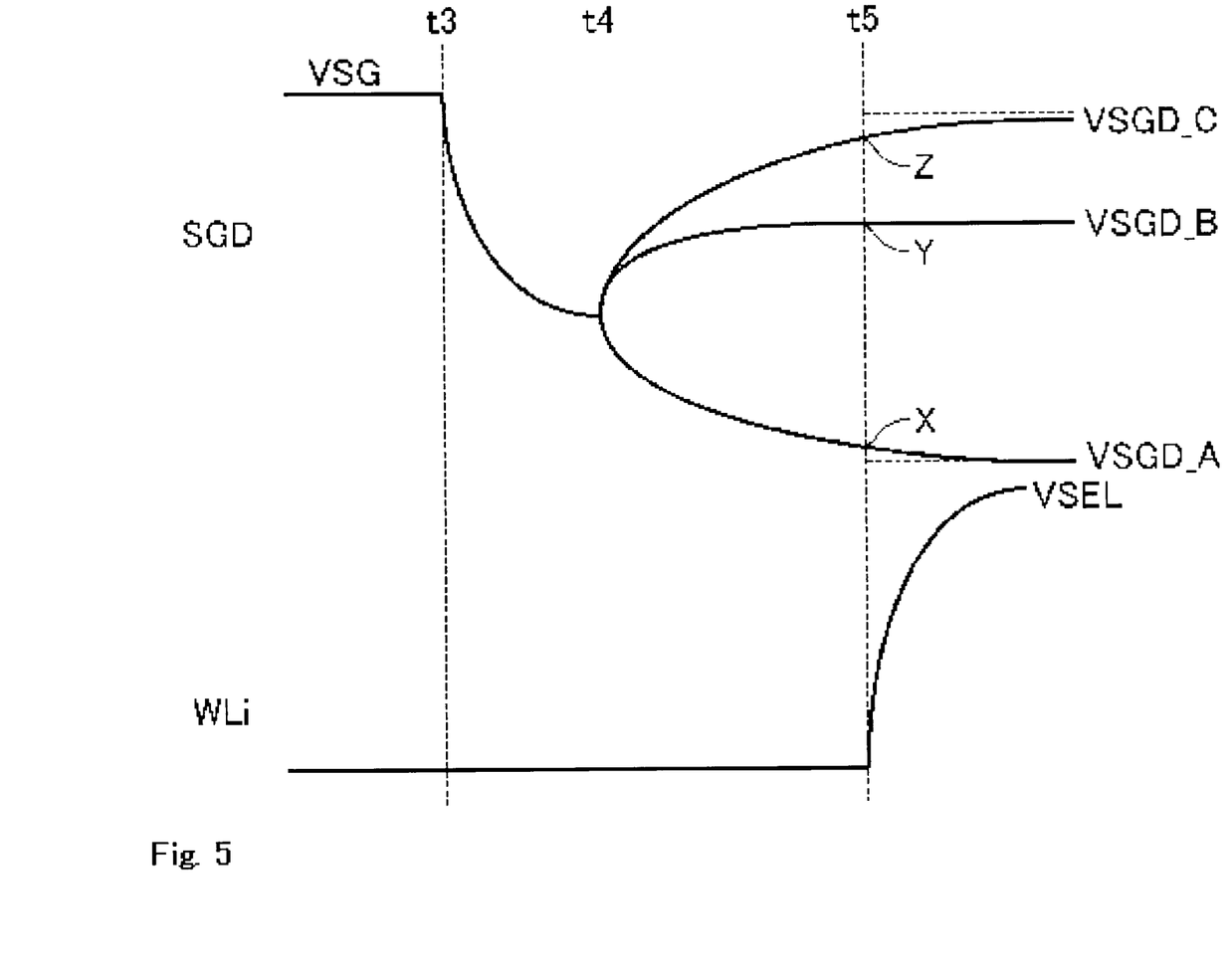
FIG. 5 is a timing chart illustrating the operation of the first embodiment.

It is assumed, for example, that the discharging circuit 70 has one discharge path. As shown in FIG. 5, there is one discharge curve from instant t3 to instant t4. Accordingly, if a discharge period t3-t4 and a subsequent charging period t4-t5 for the second select gate voltage VSGD are set to the timing Y at which an intermediate voltage VSGD_B (e.g., about 2.5 V) that is assumed to be the second select gate voltage VSGD is reached, and if the second select gate voltage VSGD is set to a voltage VSGD_A (e.g., about 1.2 V) lower than the intermediate voltage, then discharging is not sufficiently performed at instant t4. At instant t5, the voltage increases to a voltage value X higher than the set voltage VSGD_A. Furthermore, where the second select gate voltage VSGD is set to a voltage VSGD_C (e.g., around 3.6 V) higher than the assumed voltage VSGD_B, the discharging will be performed excessively at instant t4. The voltage will decrease to a voltage value Z lower than the set voltage VSGD_C at instant t5.

Figure 6:
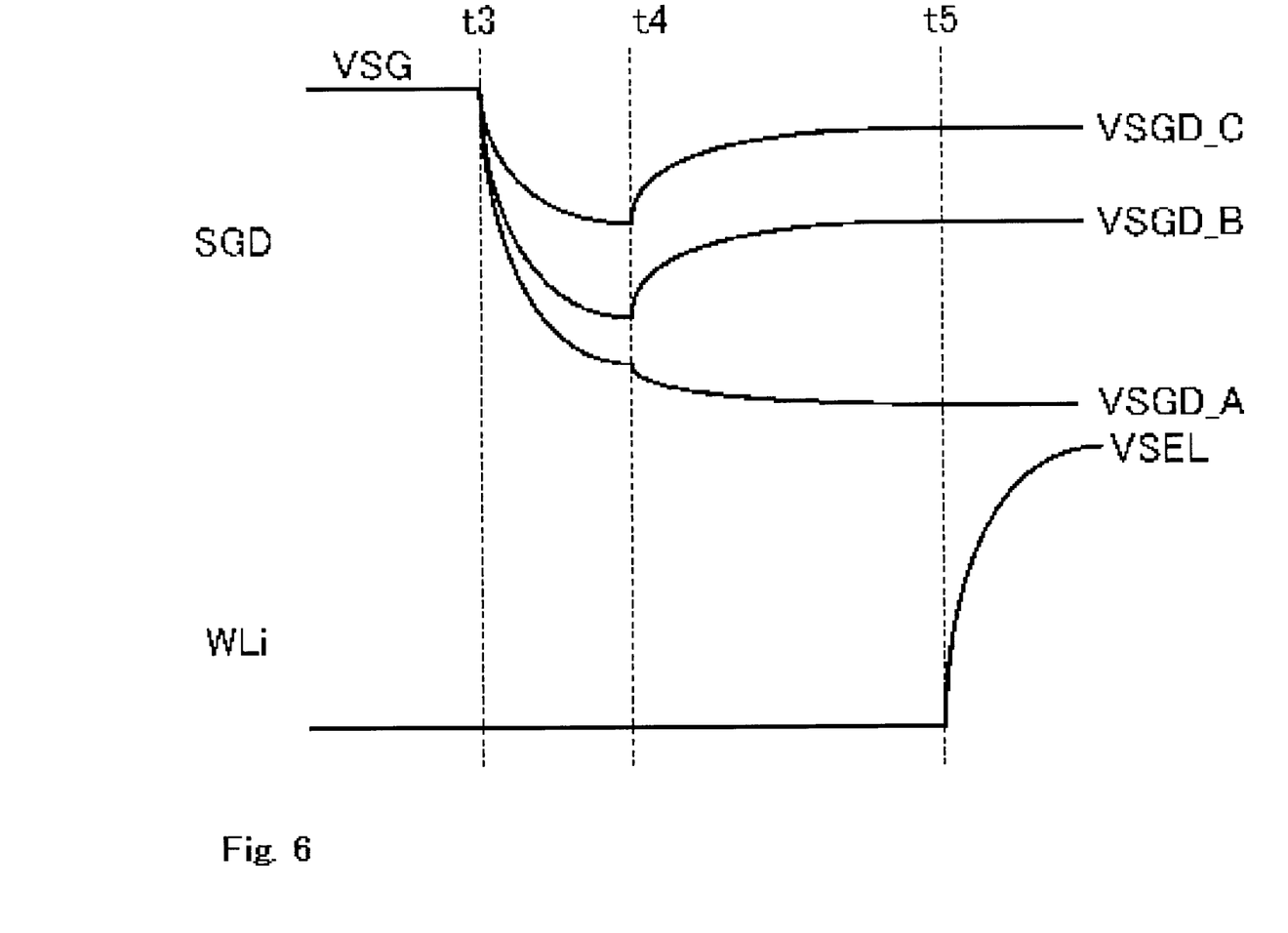
FIG. 6 is a timing chart illustrating the operation of the first embodiment.

Accordingly, in the first embodiment, the discharge path of the discharging circuit 70 is switched according to the set voltage of the second select gate voltage VSGD. FIG. 6 shows a charge-discharge curve obtained when the discharge path is switched. For example, it is assumed that VSGD_A<VSGD_B<VSGD_C. Where the second select gate voltage VSGD is VSGD_A, the select signal SA is activated to turn on the high voltage transistor 71. Where the second select gate voltage VSGD is VSGD_B, the select signal SB is activated, turning on the low voltage transistor 73. Where the second select gate voltage VSGD is VSGD_C, the select signal SC is activated, turning on the low voltage transistor 76. With respect to the discharge currents, the following relationships hold:

HV transistor 71>LV transistor 73>LV transistor 76

Therefore, as shown in FIG. 6, in a case where the second select gate voltage VSGD is VSGD_A, the discharging process has sufficiently progressed at instant t4. Where the second select gate voltage VSGD is VSGD_C, the discharging has been suppressed at the instant t4. In this way, discharging characteristics matched to the various values of the second select gate voltage VSGD are obtained. Consequently, setting of the second select gate voltage VSGD is completed in a short time.

Subsequently to the instant t5, a writing voltage VSEL of about 20 V is applied to the word lines WLi corresponding to the memory cells to be written. An intermediate voltage VUSEL of about 10 V is applied to the other word lines WL. At the same time, a voltage VBL_QPW is transferred to the bit lines BL to execute QPW (quick pass write).

Second Embodiment

Figure 7:
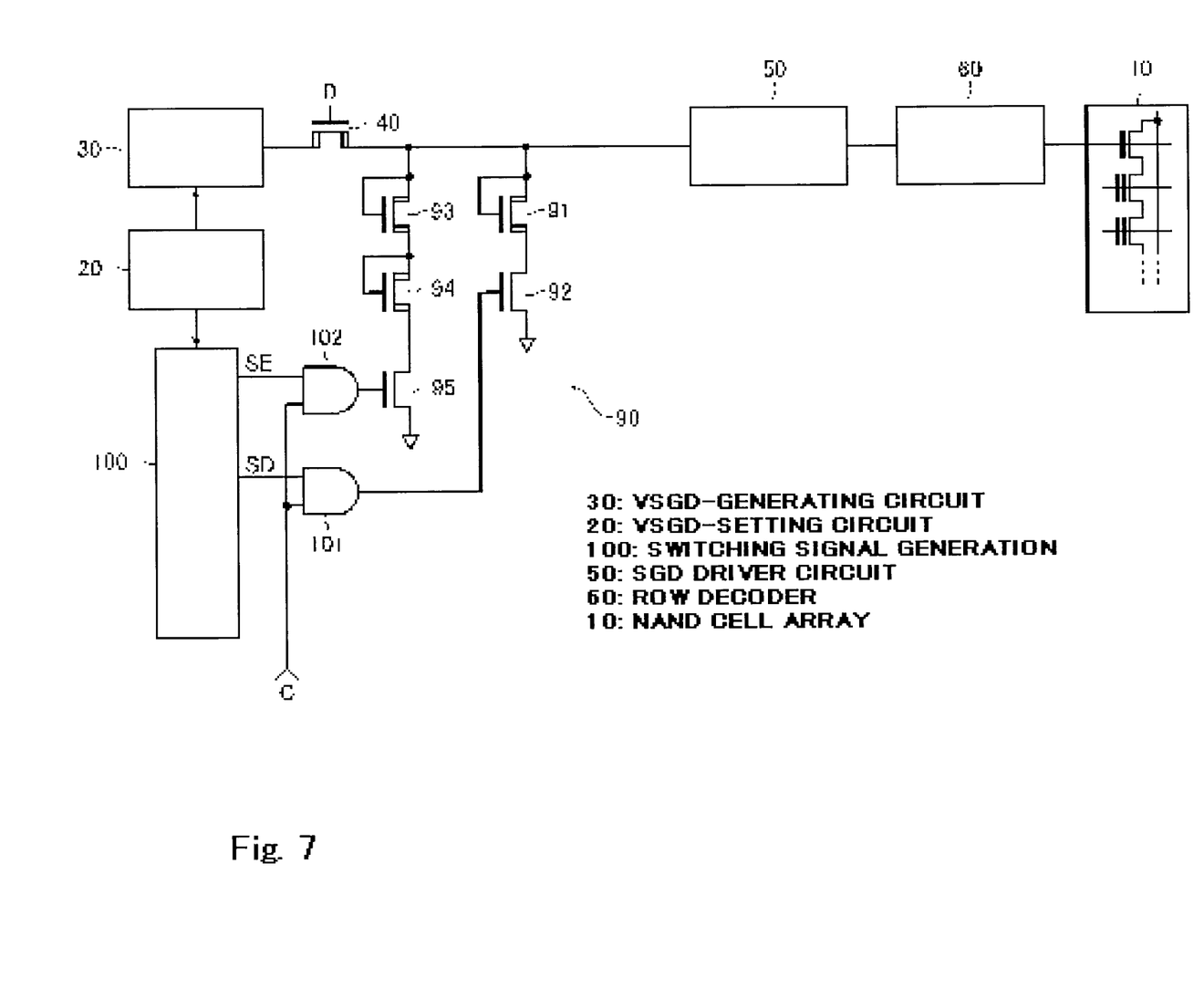
FIG. 7 is a circuit diagram of main portions of a second embodiment of the invention.

FIG. 7 is a circuit diagram of a voltage control circuit for the select gate SGD when a NAND cell array 10 associated with a second embodiment of the present invention is written. In this embodiment, a discharging circuit 90 has two discharge paths. The first path is a series combination of a diode-connected high voltage transistor 91 and a low voltage transistor 92. The second discharge path is a series combination of diode-connected high voltage transistors 93, 94 and a low voltage transistor 95. The discharge currents flowing in the paths satisfy the relationship:

discharge current in the first path>discharge current in the second path

A switching signal-generating circuit 100 and gate circuits 101, 102 together constitute a discharging characteristics selection circuit. When the second select gate voltage VSGD is VSGD_A, the switching signal-generating circuit 100 activates both select signals SD and SE and permits a discharge current to flow via the first and second discharge paths. When the second select gate voltage VSGD is VSGD_B, the switching signal-generating circuit 100 activates only the select signal SD and permits a discharge current to flow via the first discharge path alone. When the second select gate voltage VSGD is VSGD_C, the switching signal-generating circuit 100 activates only the select signal SE and permits a discharge current to flow only via the second discharge path.

Consequently, discharge characteristics matched to the various values of the second select gate voltage VSGD are obtained in the same way as in the first embodiment. Setting of the second select gate voltage VSGD is completed in a short time. In the second embodiment, the discharging circuit can be made up of a less number of transistors than in the first embodiment.

Third Embodiment

Figure 8:
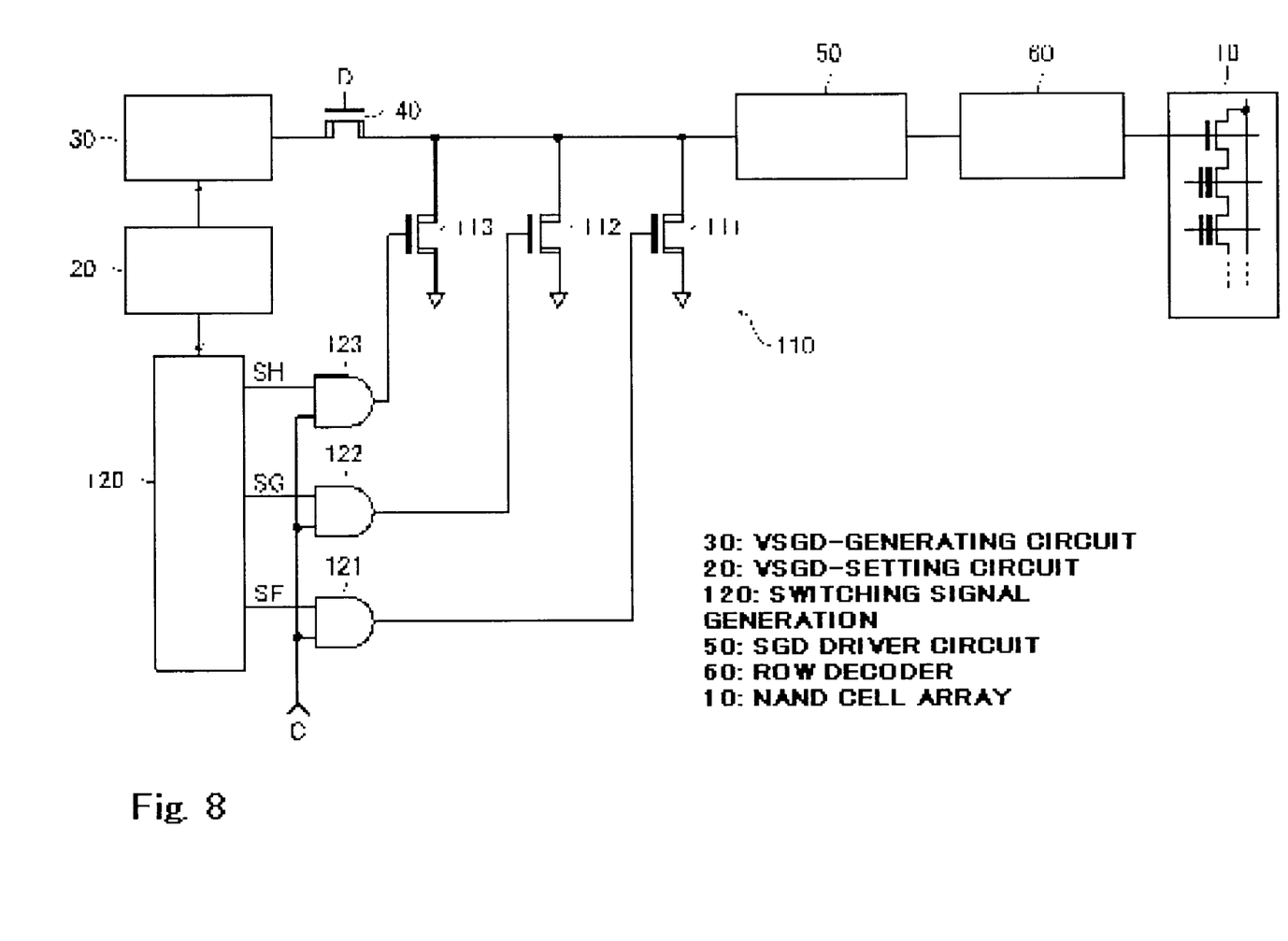
FIG. 8 is a circuit diagram of main portions of a third embodiment of the invention.

FIG. 8 is a circuit diagram of a voltage control circuit for the select gate SGD when a NAND cell array 10 associated with a third embodiment is written.

In this embodiment, a discharging circuit 110 is made of three high voltage transistors 111, 112, and 113 connected in parallel. The number of transistors turned on is varied according to the level of the second select gate voltage VSGD. A switching signal-generating circuit 120 and gate circuits 121, 122, and 123 together constitute a discharging characteristics selection circuit. When the second select gate voltage VSGD is VSGD_A, the switching signal-generating circuit 120 activates select signals SF, SG, and SH, turning on the three high-voltage transistors 111-113. When the second select gate voltage VSGD is VSGD_B, the circuit 120 activates the select signals SF and SG, turning on the two high voltage transistors 111 and 112. When the second select gate voltage VSGD is VSGD_C, the circuit 120 activates only the select signal SF, turning on only the high voltage transistor 111.

Consequently, discharging characteristics matched to the various values of the second select gate voltage VSGD are obtained in the same way as in the first embodiment. Setting of the second select gate voltage VSGD is completed in a short time. Also, in this embodiment, the discharging circuit can be made up of a less number of transistors than in the first embodiment.

Fourth Embodiment

Figure 9:
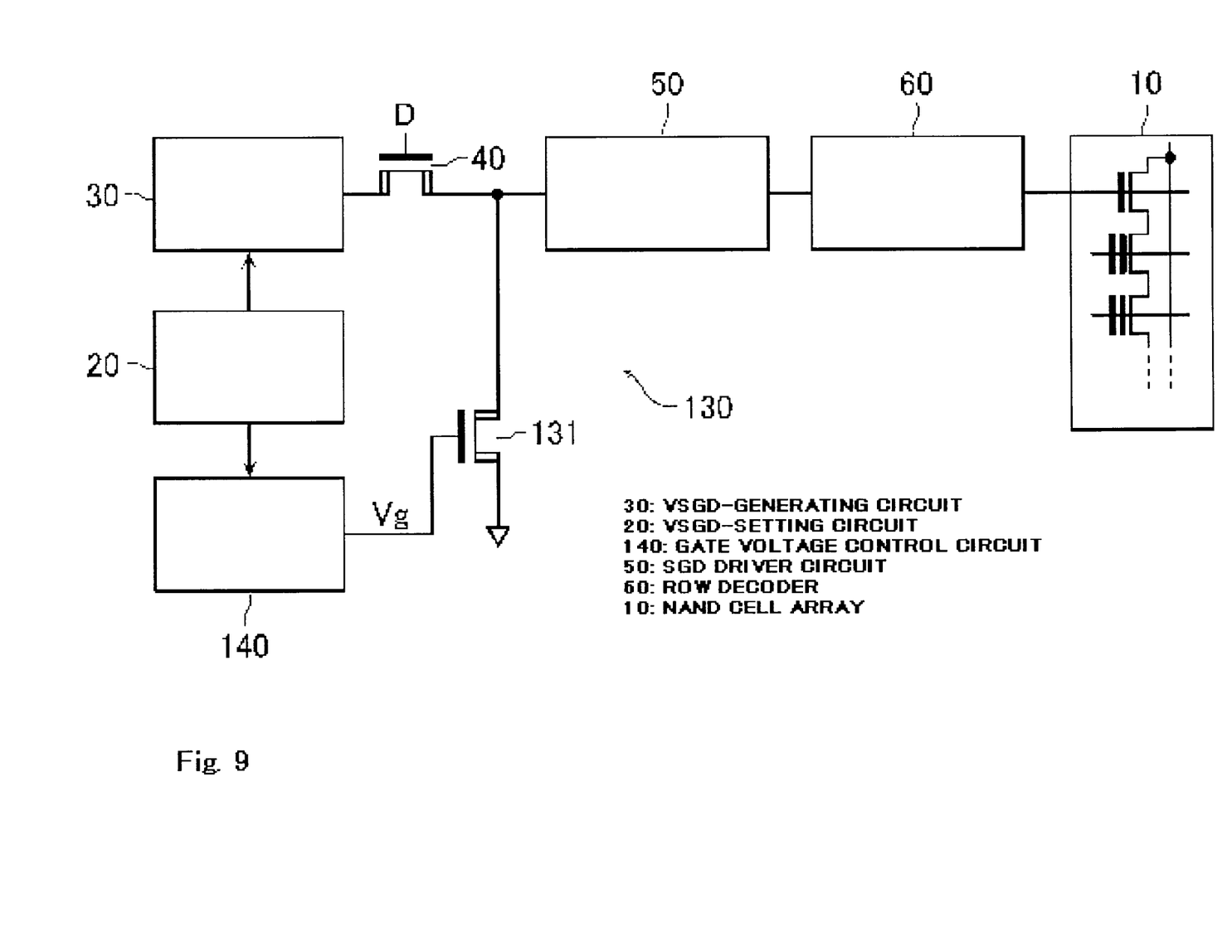
FIG. 9 is a circuit diagram of main portions of a fourth embodiment of the invention.

FIG. 9 is a circuit diagram of a voltage control circuit for the select gate SGD when a NAND cell array 10 associated with a fourth embodiment of the invention is written.

In the present embodiment, a discharging circuit 130 is made of a single high voltage transistor 131. The gate voltage Vg for the high voltage transistor 131 is applied from a gate voltage control circuit 140, based on a value set by a VSGD-setting circuit 20. When the second select gate voltage VSGD is VSGD_A, the gate voltage control circuit 140 acting as a discharging characteristics selection circuit outputs a gate voltage Vga. When the second select gate voltage VSGD is VSGD_B, the control circuit 140 outputs a gate voltage Vgb. When the second select gate voltage VSGD is VSGD_C, the control circuit 140 outputs a gate voltage Vgc. The gate voltages satisfy the relationship:

Vga>Vgb>Vgc.

Consequently, discharging characteristics matched to the various values of the second select gate voltage VSGD are obtained in the same way as in the first embodiment. Setting of the gate voltage VSGD is completed in a short time. According to this embodiment, the discharging circuit can be made up of a less number of transistors than in any of the above embodiments.

Fifth Embodiment

Figure 10:
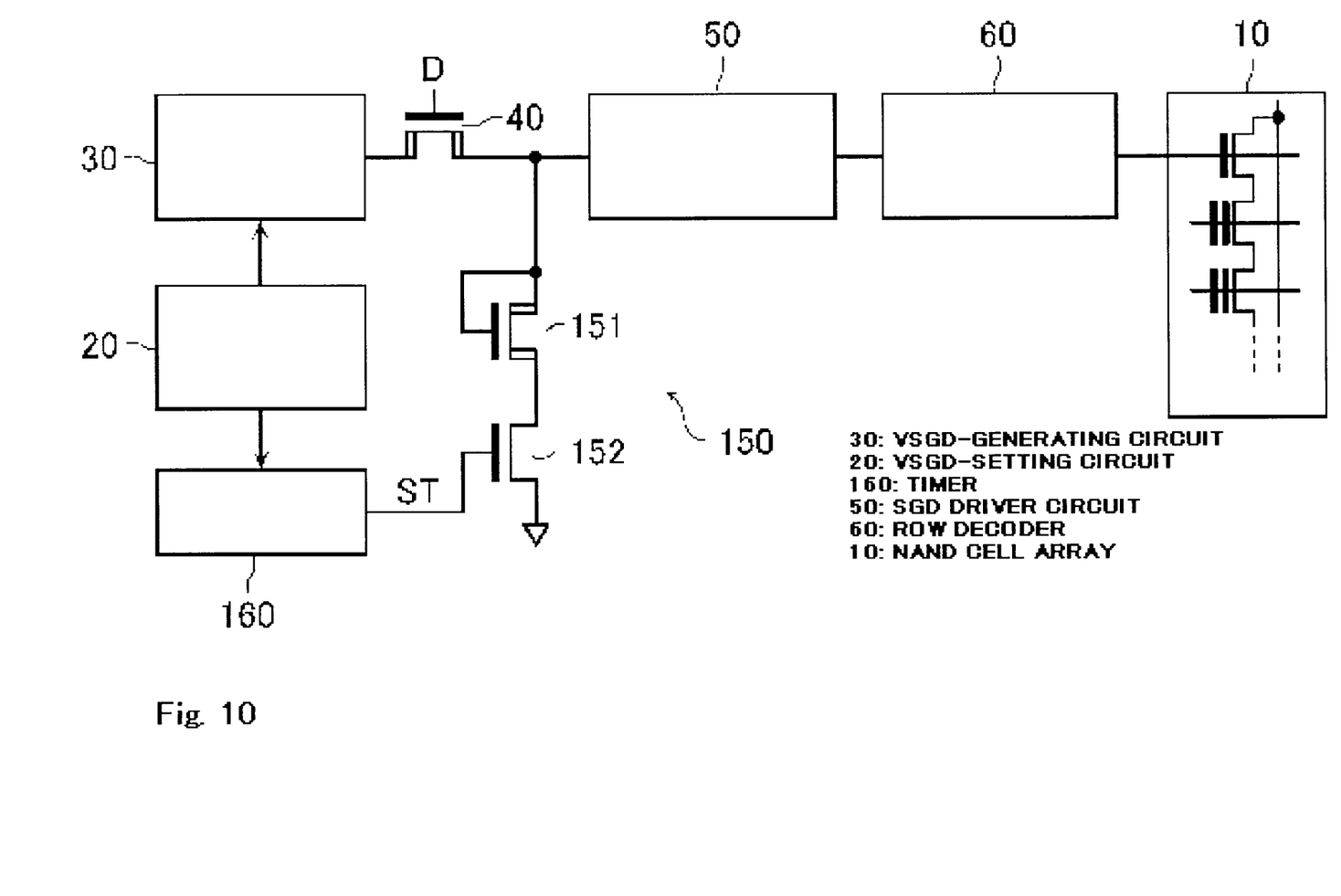
FIG. 10 is a circuit diagram of main portions of a fifth embodiment of the invention.

FIG. 10 is a circuit diagram of a voltage control circuit for a select gate SGD when a NAND cell array 10 associated with a fifth embodiment of the invention is written.

In this embodiment, a discharging circuit 150 is made of a series combination of a diode-connected high voltage transistor 151 and a low voltage transistor 152. The ON time of the low voltage transistor 152 is controlled by the voltage value of the second select gate voltage VSGD. When the second select gate voltage VSGD is VSGD_A, a timer 160 acting as a discharging characteristics selection circuit controls the low voltage transistor 152 by an ON signal ST1. When the second select gate voltage VSGD is VSGD_B, the timer controls the low voltage transistor 152 by an ON signal ST2. When the second select gate voltage VSGD is VSGD_C, the timer controls the low voltage transistor 152 by an ON signal ST3. The periods of the ON signals satisfy the relationship:

ST1>ST2>ST3.

Figure 11:
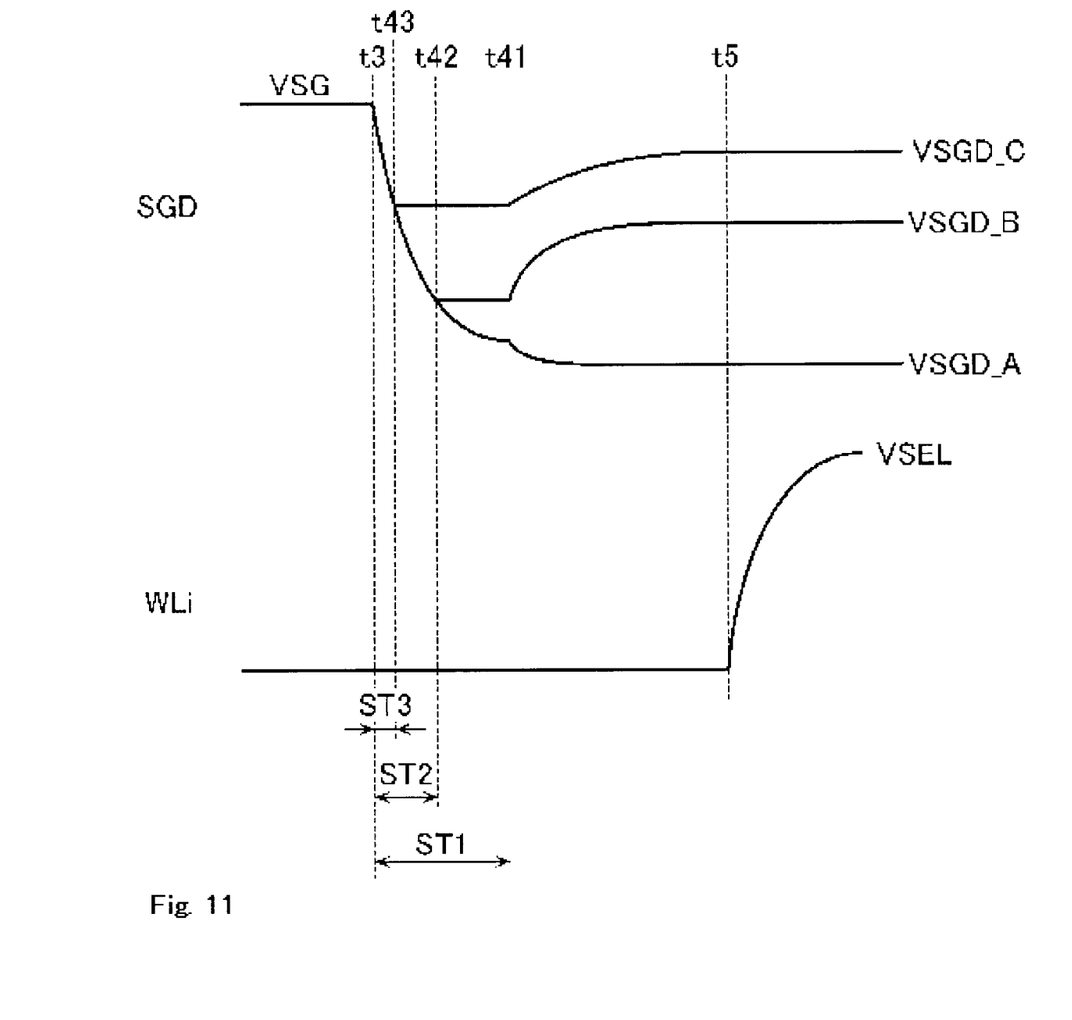
FIG. 11 is a timing chart illustrating the operation of the fifth embodiment.

FIG. 11 is a graph showing the discharging characteristics of the discharging circuit 150 of this embodiment. The discharging capability of the discharge path made of the transistors 151 and 152 is maximized. The discharge time ST1 when the second select gate voltage VSGD is VSGD_A is set to the same as in the above embodiments. Under this condition, when the second select gate voltage VSGD is VSGD_B or VSGD_C, charging can be performed from a higher voltage by terminating the discharging process at instant t42 or t43 that is earlier than the instant t41 at which the discharging ends when the second select gate voltage VSGD is VSGD_A.

As a result, setting of the second select gate voltage VSGD is completed in a short time in the same way as in the first embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array having memory cell units each formed by connecting a plurality of memory cells;
   a first and a second select gate transistors, the first select gate transistor being connected between one end of the memory cell array and a common source line, the second select gate transistor being connected between the other end of the memory cell array and bit lines;
   word lines acting also as control gates of the memory cells;
   a first select gate voltage-generating circuit for generating a first select gate voltage;
   a second select gate-setting circuit for setting an instructed value of a second select gate voltage;
   a second select gate voltage-generating circuit for generating the second select gate voltage based on the set, instructed value;
   a transfer circuit for transferring the first select gate voltage generated by the first select gate voltage-generating circuit to the second select gate;
   a discharging circuit for discharging the first select gate voltage transferred to the second select gate; and
   a discharging characteristics selection circuit for selecting discharging characteristics of the discharging circuit.

2. The semiconductor memory device of claim 1, wherein said discharging circuit has a plurality of discharge paths in which different discharging currents flow.

3. The semiconductor memory device according to claim 2, wherein said discharging circuit further includes a transistor producing a discharging current that varies according to a gate voltage.

4. The semiconductor memory device according to claim 2, wherein said discharging characteristics selection circuit controls the discharging current according to the set value of the second select gate voltage.

5. The semiconductor memory device according to claim 4, wherein said discharging characteristics selection circuit selects the discharging characteristics of said discharging circuit in such a way that as the set value of the second select gate voltage decreases, the discharging current increases.

6. The semiconductor memory device according to claim 2, wherein said discharging characteristics selection circuit selects one or more out of said plurality of discharge paths according to the value set by the second select gate voltage-setting circuit.

7. The semiconductor memory device according to claim 5, wherein said discharging characteristics selection circuit selects one or more out of said plurality of discharge paths according to the value set by the second select gate voltage-setting circuit.

8. The semiconductor memory device according to claim 5, wherein said discharging characteristics selection circuit selects the gate voltage of the second select gate transistor according to the value set by the second select gate voltage-setting circuit.

9. The semiconductor memory device according to claim 8, wherein said discharging characteristics selection circuit shortens a discharging time of said discharging circuit with increasing the value set by the second select gate voltage-setting circuit.

10. The semiconductor memory device according to claim 9, wherein said memory cell array is a NAND flash memory having floating gates and control gates.

* * * * *